United States Patent
Huang et al.

(10) Patent No.: US 9,059,675 B1
(45) Date of Patent: Jun. 16, 2015

(54) FILTER FOR ATTENUATING UNDESIRED FREQUENCIES IN A SIGNAL

(71) Applicant: Marvell International Ltd., Hamilton (BM)

(72) Inventors: Tachien David Huang, Mountain View, CA (US); Kenneth Thet Zin Oo, Milipitas, CA (US); Pierte Roo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 84 days.

(21) Appl. No.: 13/857,970

(22) Filed: Apr. 5, 2013

Related U.S. Application Data

(60) Provisional application No. 61/621,917, filed on Apr. 9, 2012.

(51) Int. Cl.
*H03F 3/191* (2006.01)
*H03H 7/01* (2006.01)
*H03F 3/45* (2006.01)

(52) U.S. Cl.
CPC ......... *H03H 7/0138* (2013.01); *H03F 3/45179* (2013.01); *H03F 3/191* (2013.01)

(58) Field of Classification Search
CPC . H03F 3/245; H03F 2200/451; H03F 1/0277; H03F 3/195; H03F 2203/45526; H03F 2203/45544; H03F 2203/45594; H03F 2203/45694; H03F 2203/45712; H03F 2203/45718

USPC .......................................... 330/284, 303–306
See application file for complete search history.

(56) References Cited

U.S. PATENT DOCUMENTS

| | | | | |
|---|---|---|---|---|
| 4,764,938 A | * | 8/1988 | Meyer | 333/18 |
| 6,492,865 B1 | * | 12/2002 | Thomasson | 330/306 |
| 6,803,812 B2 | * | 10/2004 | Kawai | 330/107 |
| 2006/0280317 A1 | * | 12/2006 | Panulas | 381/94.1 |

OTHER PUBLICATIONS

Carter, Bruce, "High-speed notch filters", Analog Applications Journal, 1Q 2006, High-Performance Analog Products, pp. 19-26.

* cited by examiner

*Primary Examiner* — Khanh V Nguyen

(57) ABSTRACT

In some implementations, a circuit includes an operational amplifier having a positive input, a negative input, and an output, the output being connected to the negative input; a first capacitor to receive the input signal; a second capacitor connected in series with the first capacitor, the second capacitor to provide a first signal to a positive input of the operational amplifier; a first resistor connected in series with the first capacitor, the first resistor to provide a second signal to the negative input of the operational amplifier; a second resistor to receive the input signal; a third resistor connected in series with the second resistor, the third resistor to provide a third signal to the positive input of the operational amplifier; and a third capacitor connected in series with the second resistor, the third capacitor to provide a fourth signal to the negative input of the operational amplifier.

11 Claims, 4 Drawing Sheets

FILTER FOR ATTENUATING UNDESIRED FREQUENCIES IN A SIGNAL

CROSS REFERENCE TO RELATED APPLICATION

This disclosure claims the benefit of the priority under 35 U.S.C. §119(e) of U.S. Provisional Application No. 61/621,917, filed on Apr. 9, 2012, titled "Use of High Quality Factor, Inductorless Notch Filter to Eliminate Electra-Magnetic Interference in High Speed Communication Systems," the disclosure of which is hereby incorporated by reference in its entirety.

FIELD OF USE

The present disclosure relates to attenuating undesired frequencies in a signal.

BACKGROUND

Electromagnetic interference (EMI) is disturbance that can affect a communication system due to electromagnetic radiation emitted from an external source. EMI can interrupt, obstruct, degrade, or limit the performance of the communication system. The effects of EMI can range from a degradation of data to a total loss of data. The source of EMI may be any artificial or natural object that carries rapidly changing electrical currents.

EMI may be a serious concern for high speed communication systems that include long physical channels. An example of a communication system that can be affected by EMI includes a 10GBase-T Ethernet system that transfers data at a rate of 10 gigabits per second over Ethernet cables having lengths of up to 100 meters. For a 10GBase-T system having a signal bandwidth as high as 400 megahertz (MHz), EMI near 400 MHz, such as EMI emitted from a cell phone operating at a frequency of 850 MHz or a walkie-talkie operating at a frequency of 460 MHz, can severely degrade the signal-to-noise ratio (SNR) of the 10GBase-T system. A 10GBase-T system may also be adversely affected by EMI at a frequency around 800 MHz resulting from a coupling of signals between adjacent cables.

FIG. 1 is a frequency graph 100 showing examples of desired frequencies 102 and undesired frequencies 104, 106, 108 in a signal. In FIG. 1, the desired frequencies 102 represent, for example, the signal bandwidth of a 10GBase-T Ethernet communication system. In a 10GBase-T system, the signal bandwidth can be as high as 400 MHz. One or more undesired frequencies 104, 106, 108 may be injected into the communication signal from nearby sources, such as a walkie-talkie operating at a frequency of 460 MHz or a cell phone operating at a frequency of 850 MHz, or from a coupling of signals between adjacent cables of the 10GBase-T system that produces a disturbance at a frequency around 800 MHz.

FIG. 2 is a block diagram showing an example of a lowpass filter chain 200 that may be used to attenuate undesired frequencies in an input signal, e.g., the undesired frequencies 104, 106, 108 of FIG. 1, and to provide a filtered version of the input signal as an output signal. The lowpass filter chain 200 includes multiple first-order lowpass filters, e.g., LPF(1) and LPF(2) to LPF(N). N stages of first-order lowpass filters can be cascaded to implement an Nth-order lowpass filter. The frequencies of cascading lowpass filters in the lowpass filter chain 200 must align with each other so that the lowpass filters collectively have the desired frequency response. To achieve the desired attenuation of undesired frequencies that are very close to a desired frequency, a high-order lowpass filter may be needed.

FIG. 3 is a frequency graph showing examples of frequency responses 300 of the lowpass filter chain 200 of FIG. 2. As the number of stages of lowpass filters increases, roll-off of the frequency response increases which causes increasing attenuation of frequencies near and above the cutoff frequency fc. If an undesired frequency is very close to a desired frequency, the cutoff frequency may need to be near the desired frequency to sufficiently reduce the undesired frequency. When the cutoff frequency is near the desired frequency, the lowpass filter chain may also attenuate the desired frequency.

To attenuate an undesired frequency that is very close to a desired frequency, a notch filter may be used. FIG. 4 is a schematic diagram showing an example of a notch filter 400 that may be used to attenuate an undesired frequency in a signal. The notch filter 400 is implemented using passive components that do not depend on an external power supply. The notch filter 400 includes a resistor 402, an inductor 404, and a capacitor 406. The notch frequency of the notch filter 400 is dependent on the values of the resistor 402 and the capacitor 406. The notch filter 400 receives an input voltage Vin of an input signal and provides an output voltage Vout of an output signal. The notch filter 400 passes most frequencies unaltered, but attenuates a narrow band of frequencies to very low levels. To implement a notch filter that includes inductors with a high quality (Q) factor, the inductors may need to be accurately modeled and sufficiently protected from electromagnetic interferences.

FIG. 5 is a frequency graph showing examples of frequency responses 500 of a notch filter, e.g., the notch filter 400 of FIG. 4. As the Q factors of the inductors increase, the band of frequencies that are attenuated becomes smaller, and the amount of attenuation at the undesired frequency $f_{notch}$ increases. In other words, as the Q factors of the inductors decrease, the band of frequencies that are attenuated become larger, and the amount of attenuation at the undesired frequency $f_{notch}$ decreases. Using a notch filter that includes inductors having low Q factors may also attenuate a desired frequency, in addition to the undesired frequency, when the notch frequency of the notch filter is near the desired frequency of the signal.

FIG. 6 is a schematic diagram showing an example of a notch filter 600 that may be used to attenuate an undesired frequency in a signal. The notch filter 600 is an active twin-T notch filter. The notch filter 600 receives an input voltage Vin of an input signal and provides an output voltage Vout of an output signal. The notch filter 600 includes capacitors 602, 604, 606, resistors 608, 610, 612, 614, 616, and an operational amplifier 618.

The capacitors 602 and 604 each have a capacitance value C. The capacitor 606 has a capacitance value 2C or two times the capacitance value C of capacitor 602 or 604. The resistors 608 and 610 each have a resistance value R. The resistor 612 has a resistance value R/2 or half of the resistance value R of resistor 608 or 610. The ratio of the resistance value R of the resistors 608 or 610 to the resistance value R/2 of the resistor 612 is 2. The ratio of the capacitance value 2C of capacitor 606 to the capacitance value C of capacitors 602 and 604 is 2. The resistor 614 has a resistance value Ra, and the resistor 616 has a resistance value Rb. The resistance values Ra and Rb are typically much less, e.g., an order of magnitude smaller, than the resistance value R. The notch frequency $f_{notch}$ of the notch filter 600 is determined by the capacitance value C and the resistance value R, and is defined by the equation $f_{notch}=1/$ $2\pi RC$. The Q factor of the notch filter 600 is determined by the values Ra and Rb of the resistors 614 and 616, and is defined by the equation Q=Ra/4Rb. For example, a filter having a resistance value R of 100 Kohms, a capacitance value C of 1 pF, a resistance value Ra of 10 Kohms, and a resistance value Rb of 250 ohms can achieve a notch frequency of 1.6 MHz and a Q factor of 1.0.

Similar to the notch filter 400, the notch filter 600 attenuates a specific frequency of an input signal while allowing all other frequencies to pass unaltered. In contrast to the notch filter 400 of FIG. 4, the notch filter 600 does not include any inductors. The notch filter 600 passes low frequency signals unaltered through the series resistor path that includes the resistors 608 and 610, and passes high frequency signals unaltered through the series capacitor path that includes the capacitors 602 and 604. At notch frequency, the feedback from the operational amplifier 618 facilitates cancellation of signals from the series resistor path and the series capacitor path that are 180 degrees out of phase. Thus, the notch filter 600 operates without the use of an inductor.

The notch frequency $f_{notch}$ of the notch filter 600 can be adjusted independently of the Q factor because the notch frequency is dependent on the resistance value R and the capacitance value C whereas the Q factor is dependent on the resistance values Ra and Rb. Such independent adjustability of notch frequency and the Q factor of the notch filter 600 eliminates the need for inductors with high Q factors. Because a notch filter attenuates only frequencies in a narrow band, additional lowpass filters may be needed to further process the signal to reduce undesired frequencies that are higher than the notch frequency of the notch filter.

SUMMARY

The present disclosure describes systems and techniques relating to a filter for attenuating undesired frequencies in a signal. In general, in one aspect, a circuit includes an operational amplifier, three capacitors, and three resistors. The operational amplifier has a positive input, a negative input, and an output. The output of the operational amplifier is connected to a negative input. A first capacitor receives an input signal. A second capacitor is connected in series with the first capacitor and provides a first signal to a positive input of the operational amplifier. A first resistor is connected in series with the first capacitor and provides a second signal to the negative input of the operational amplifier. A second resistor receives the input signal. A third resistor is connected in series with the second resistor and provides a third signal to the positive input of the operational amplifier. A third capacitor is connected in series with the second resistor and provides a fourth signal to the negative input of the operational amplifier. The operational amplifier provides a filtered version of the input signal at the output.

In another aspect, a circuit includes a first path, a second path, a third path, and a fourth path. The first path includes a first capacitor and a second capacitor connected in series from an input of the circuit to a positive input of an operational amplifier. The second path includes the first capacitor and a first resistor connected in series from the input of the circuit directly to a negative input of the operational amplifier. The third path includes a second resistor and a third resistor connected in series from the input of the circuit to the positive input of the operational amplifier. The fourth path includes the second resistor and a third capacitor connected in series from the input of the circuit directly to the negative input of the operational amplifier. The operational amplifier includes an output that is connected to the negative input of the operational amplifier.

The described systems and techniques can be implemented so as to realize none, one, or more of the following advantages. The circuit may be used to attenuate an undesired frequency that is very close to a desired frequency, without significantly attenuating the desired frequency which may occur when using a high-order low pass filter or a notch filter with a low Q factor. The circuit is a single-stage filter that has a frequency response similar to a combination of a notch filter and a lowpass filter. The circuit attenuates an undesired frequency that is closest to a desired frequency while also suppressing higher undesired frequencies. The circuit reduces or eliminates additional stages of lowpass filtering following the circuit. If additional stages of lowpass filtering are needed, the additional stages may be implemented as a low-order lowpass filter, and the frequencies of the additional stages need not align with each other. Reducing or eliminating additional stages of lowpass filtering may reduce noise, power consumption, and integration costs of a signal processing system and reduce signal distortion and data loss.

Details of one or more implementations are set forth in the accompanying drawings and the description below. Other features, objects, and advantages may be apparent from the description and drawings, and from the claims.

DETAILED DESCRIPTION

Various implementations of the present disclosure are discussed below in conjunction with an example of a communication system. The system and techniques described in this disclosure are generally applicable to any signal processing system in which it is desirable to attenuate undesired frequencies that may be present in a signal.

Figure 1:
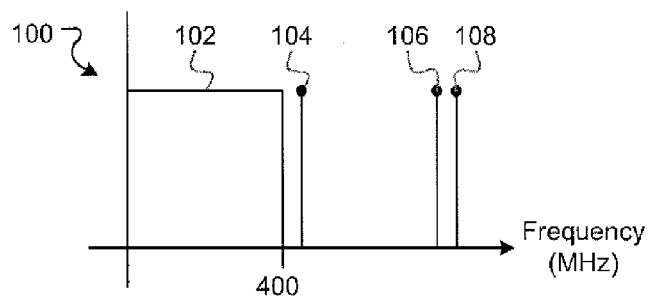
FIG. 1 is a frequency graph showing examples of desired frequencies and undesired frequencies in a signal.
Figure 2:
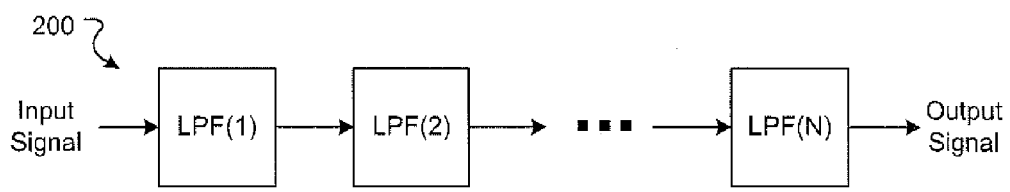
FIG. 2 is a block diagram showing an example of a lowpass filter chain that may be used to attenuate undesired frequencies in a signal.
Figure 3:
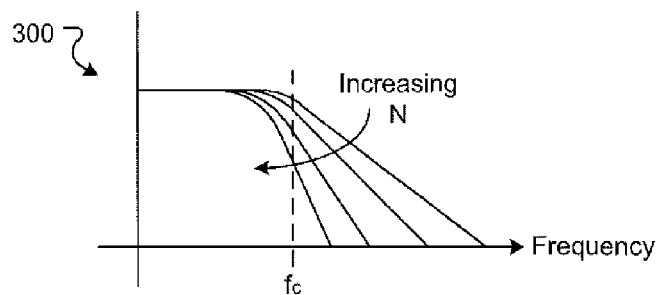
FIG. 3 is a frequency graph showing examples of frequency responses of a lowpass filter chain.
Figure 4:
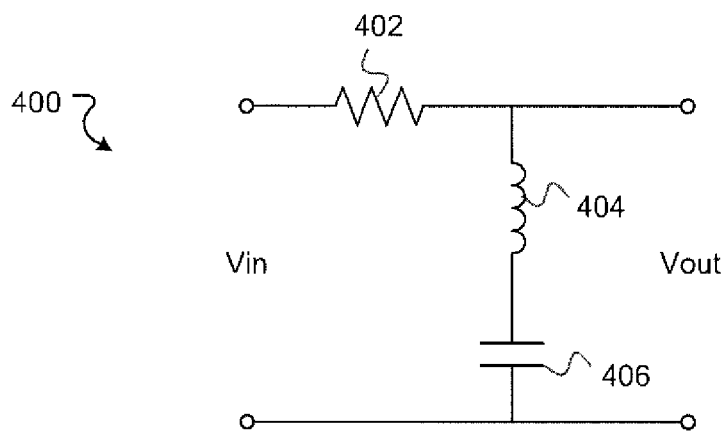
FIG. 4 is a schematic diagram showing an example of a notch filter that may be used to attenuate an undesired frequency in a signal.
Figure 5:
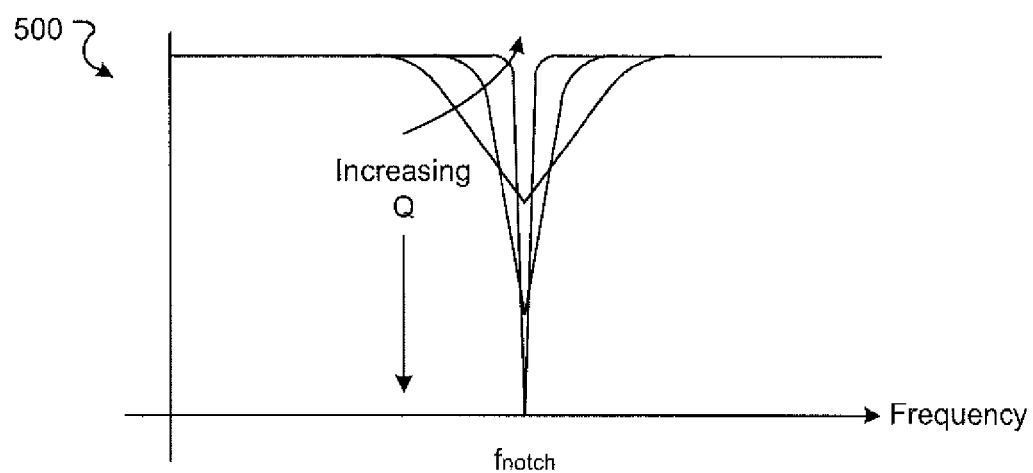
FIG. 5 is a frequency graph showing examples of frequency responses of a notch filter.
Figure 6:
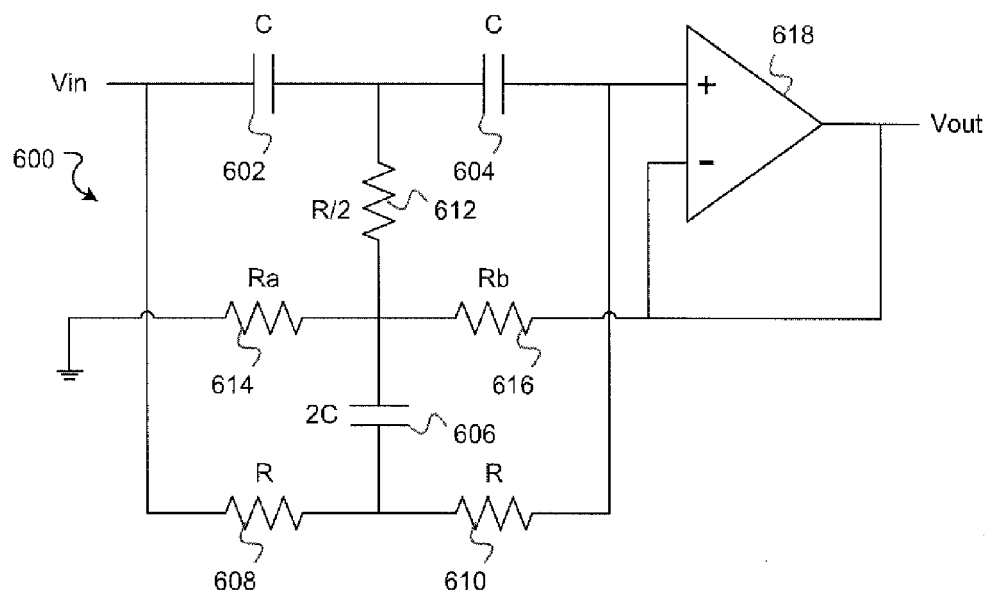
FIG. 6 is a schematic diagram showing an example of a notch filter that may be used to attenuate an undesired frequency in a signal.
Figure 7:
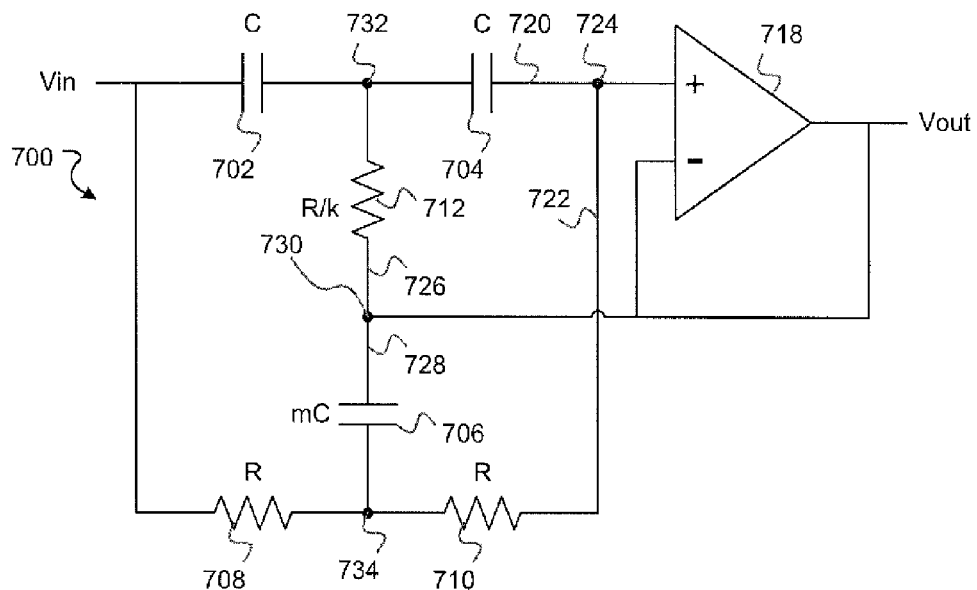
FIG. 7 is a schematic diagram of an example of a filter circuit that may be used to attenuate undesired frequencies in a signal in accordance with an implementation of the disclosure.

FIG. 7 is a schematic diagram of an example of a filter circuit 700 that may be used to attenuate an undesired frequency near a desired frequency while also suppressing other higher undesired frequencies. The filter circuit 700 has a third-order frequency response that is similar to a combination of a notch filter and a low-order lowpass filter. Using the filter circuit 700 to attenuate undesired frequencies in a signal may reduce the number of lowpass filters that are needed to sufficiently attenuate the undesired frequencies as compared to lowpass filter chain 200 of FIG. 2, the notch filter 400 of FIG. 4, and the notch filter 600 of FIG. 6.

The filter circuit 700 receives an input voltage Vin of an input signal and provides an output voltage Vout of an output signal. The filter circuit 700 includes capacitors 702, 704, 706, resistors 708, 710, 712, and an operational amplifier 718. The operational amplifier 718 has a positive input, a negative input, and an output Vout. The output Vout of the operational amplifier 718 is connected to the negative input to provide negative feedback.

The filter circuit 700 includes two T networks. The first T network includes capacitors 702 and 704 and resistor 712. The capacitor 702 receives an input voltage Vin of an input signal. The capacitor 702 is connected in series with the capacitor 704 and in series with the resistor 712. The resistor 712 is connected as a leg extending from a node 732 between the capacitor 702 and the capacitor 704. The capacitor 704 is connected to the positive input of the operational amplifier 718. The resistor 712 is connected directly to the negative input of the operational amplifier 718.

The second T network includes resistors 708 and 710 and capacitor 706. The resistor 708 receives an input voltage Vin of the input signal. The resistor 708 is connected in series with the resistor 710 and in series with the capacitor 706. The capacitor 706 is connected as a leg extending from a node 734 between the resistor 708 and the resistor 710. The resistor 710 is connected to the positive input of the operational amplifier 718. The capacitor 706 is connected directly to the negative input of the operational amplifier 718.

The capacitors 702 and 704 may have substantially the same capacitance value C, allowing for practical tolerances (e.g., a nominal capacitance value ±5%) assigned to each discrete component by its manufacturer. The capacitor 706 has a capacitance value mC or m times the capacitance value C of capacitor 702 or 704. The resistors 708 and 710 each have substantially the same resistance value R, allowing for practical tolerances (e.g., a nominal resistance value ±5%) assigned to each discrete component by its manufacturer. The resistor 712 has a resistance value R/k or a one-kth of the resistance value R of resistor 708 or 710. The notch frequency $f_{notch}$ of the filter circuit 700 is determined by the capacitance value C and the resistance value R, and is defined by the equation $f_{notch}=1/2\pi RC$ when k=m. The Q factor of the filter circuit 700 is proportional to the value k.

The filter circuit 700 operates by phase shifting the signals in paths 720 and 722 and combining the phase shifted signals at node 724. The path 720 includes the capacitor 702 and the capacitor 704 connected in series. The path 720 passes high frequency signals. The cutoff frequency at which path 720 passes high frequency signals is dependent on the capacitance values of the capacitor 702 and the capacitor 704. The path 722 includes the resistor 708 and the resistor 710 connected in series. The path 722 passes low frequency signals. The cutoff frequency at which path 722 passes low frequency signals is dependent on the resistance values of the resistors 708 and 710. Similarly, the signals in paths 726 and 728 are phase shifted and combined at node 730. The path 726 includes the capacitor 702 and the resistor 712 connected in series. The path 728 includes the resistor 708 and the capacitor 706 connected in series. Thus, the filter circuit 700 is a combination of a lowpass filter and a highpass filter in which the resistance values and capacitance values are selected such that signals are attenuated at a desired notch frequency and suppressed at frequencies higher than the notch frequency.

At the notch frequency $f_{notch}$, the signals passing through the paths 720 and 722 are 180 degrees out of phase and cancel each other when combined at node 724 which is connected to the positive input of the operational amplifier 718. Similarly, the signals passing through the paths 726 and 728 are 180 degrees out of phase and cancel each other when combined at node 730 which is connected to the negative input of the operational amplifier 718. Feedback from the operational amplifier 718 facilitates cancellation of the signals. Canceling of the signals at the notch frequency attenuates that particular frequency of the input signal.

The amount of attenuation at the notch frequency, referred to as the notch depth, is determined by the capacitance value mC of capacitor 706 and the resistance value R/k of resistor 712. In contrast to the notch filter 600 of FIG. 6, the ratio requirement of the resistors and the capacitors in the filter circuit 700 are decoupled. The ratio of the resistance value R of the resistors 708 or 710 to the resistance value R/k of the resistor 712 may be different from the ratio of the capacitance value mC of the capacitor 706 to the capacitance value C of the capacitors 702 or 704. In other words, the value k does not need to equal the value in, and the values k and m need not equal 2. Higher k and m values will result in a filter circuit 700 that has a sharpened response by increasing the amount of attenuation at the notch frequency. This results in the filter circuit 700 having a notch frequency that can be adjusted independently of the amount of attenuation at the notch frequency and a quality factor of the filter circuit. The filter circuit 700 has a filter function of order 3.

The filter circuit 700 may be used to also suppress other undesired frequencies higher than the notch frequency. At high frequencies, the capacitors 702 and 704 have a much lower impedance than the resistors 708 and 710. Frequencies higher than the notch frequency can be suppressed using the filter circuit 700 by selecting the resistance value R such that the ratio of R to R/k provides a larger signal division.

Figure 8:
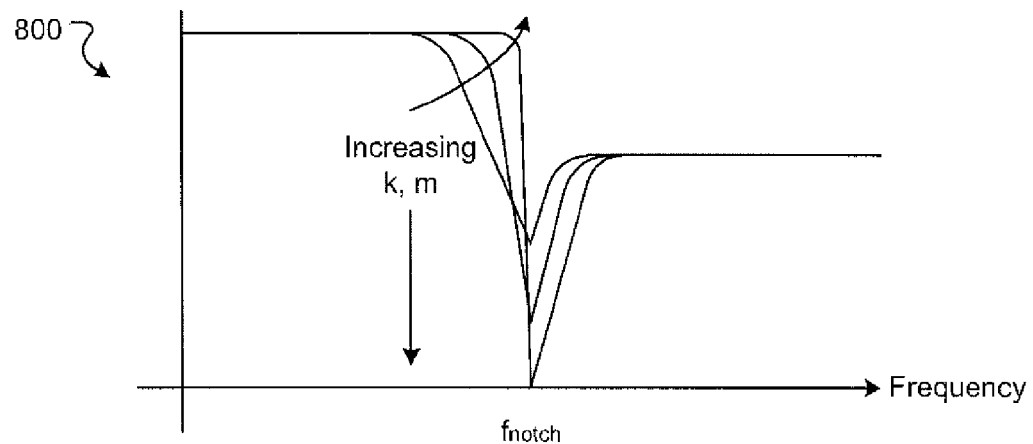
FIG. 8 is a frequency graph showing examples of frequency responses of the filter circuit of FIG. 7.

FIG. 8 is a frequency graph showing examples of frequency responses 800 of the filter circuit 700 of FIG. 7. The filter circuit 700 may have a frequency response that is a combination of a notch filter and a low-ordered lowpass filter. As the values k and m increase, the roll-off of the frequency response of the filter circuit 700 becomes sharper, and the amount of attenuation at the notch frequency increases. As shown in FIG. 8, the filter circuit 700 also suppresses frequencies higher than the notch frequency. Thus, the number of lowpass filters that are needed after the filter circuit 700 to sufficiently attenuate frequencies higher than the notch frequency may be reduced as compared to lowpass filter chain 200 of FIG. 2, the notch filter 400 of FIG. 4, and the notch filter of FIG. 6.

Figure 9:
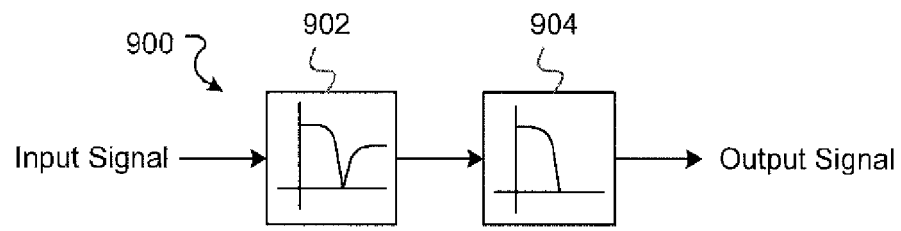
FIG. 9 is a block diagram showing an example of a circuit that includes the filter circuit of FIG. 7 followed by a lowpass filter.

FIG. 9 is a block diagram showing an example of a circuit 900 that includes a filter circuit 902, e.g., the filter circuit 600 of FIG. 6 or the filter circuit 700 of FIG. 7, followed by a low-order lowpass filter 904. The circuit 900 receives an input signal and provides a filtered version of the input signal as an output signal. The filter circuit 902 has a notch frequency that attenuates an undesired frequency that is nearest to a desired frequency of the input signal. The filter circuit 902 also attenuates frequencies that are higher than the notch frequency. The lowpass filter 904 may be included to further attenuate the frequencies that are higher than the notch frequency. The lowpass filter 904 may have a cutoff frequency that is further away from the desired frequency than the notch frequency. When the cutoff frequency of the lowpass filter 904 is sufficiently far from the desired frequency such that the roll-off of the lowpass filter 904 will not affect the desired frequency of the input signal, the lowpass filter 904 may be a low-order lowpass filter and need not have a sharp roll-off response.

A few implementations have been described in detail above, and various modifications are possible. The circuits described above may be implemented in electronic circuitry, computer hardware, firmware, software, or in combinations of them, such as the structural means disclosed in this specification and structural equivalents thereof, including system on chip (SoC) implementations.

While this specification contains many specifics, these should not be construed as limitations on the scope of what may be claimed, but rather as descriptions of features that may be specific to particular embodiments. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Other implementations fall within the scope of the following claims.

What is claimed is:

1. A circuit comprising:
   an operational amplifier having an output connected to a negative input of the operational amplifier, the operational amplifier configured to provide at the output a filtered version of an input signal;
   a first capacitor to receive the input signal;
   a second capacitor connected in series with the first capacitor, the second capacitor to provide a first signal to a positive input of the operational amplifier;
   a first resistor connected in series with the first capacitor, the first resistor to provide a second signal to the negative input of the operational amplifier;
   a second resistor to receive the input signal;
   a third resistor connected in series with the second resistor, the third resistor to provide a third signal to the positive input of the operational amplifier; and
   a third capacitor connected in series with the second resistor, the third capacitor to provide a fourth signal to the negative input of the operational amplifier,
   wherein a capacitance value of the first capacitor, a capacitance value of the second capacitor, a resistance value of the second resistor, and a resistance value of the third resistor determine an attenuation frequency of the input signal, and
   wherein a capacitance value of the third capacitor and a resistance value of the first resistor determine amounts of attenuation in the input signal at and above the attenuation frequency, and an amount of attenuation at the frequency is greater than an amount of attenuation above the frequency.

2. The circuit of claim 1, wherein a capacitance value of the first capacitor equals a capacitance value of the second capacitor, and a capacitance value of the third capacitor is greater than a capacitance value of the first capacitor.

3. The circuit of claim 1, wherein a resistance value of the first resistor is less than a resistance value of the second resistor, and a resistance value of the second resistor equals a resistance value of the third resistor.

4. The circuit of claim 1, wherein a ratio of the resistance value of the first resistor to the resistance value of the second resistor is different from a ratio of the capacitance value of the second capacitor to the capacitance value of the third capacitor.

5. A circuit comprising:
   an operational amplifier having a positive input, a negative input, and an output, the output being connected to the negative input;
   a first path including a first capacitor and a second capacitor connected in series from an input of the circuit to the positive input of the operational amplifier;
   a second path including the first capacitor and a first resistor connected in series from the input of the circuit directly to the negative input of the operational amplifier;
   a third path including a second resistor and a third resistor connected in series from the input of the circuit to the positive input of the operational amplifier; and
   a fourth path including the second resistor and a third capacitor connected in series from the input of the circuit directly to the negative input of the operational amplifier.

6. The circuit of claim 5, wherein a capacitance value of the first capacitor equals a capacitance value of the second capacitor, and a capacitance value of the third capacitor is greater than a capacitance value of the first capacitor.

7. The circuit of claim 5, wherein a resistance value of the first resistor is less than a resistance value of the second resistor, and a resistance value of the second resistor equals a resistance value of the third resistor.

8. The circuit of claim 5, wherein a ratio of the resistance value of the first resistor to the resistance value of the second resistor is different from a ratio of the capacitance value of the second capacitor to the capacitance value of the third capacitor.

9. The circuit of claim 5, wherein a capacitance value of the first capacitor, a capacitance value of the second capacitor, a resistance value of the second resistor, and a resistance value of the third resistor determine an attenuation frequency of the input signal.

10. The circuit of claim 9, wherein a capacitance value of the third capacitor and a resistance value of the first resistor determine amounts of attenuation in the input signal at and above the attenuation frequency, and an amount of attenuation at the frequency is greater than an amount of attenuation above the frequency.

11. The circuit of claim 5, further comprising a lowpass filter connected to the output of the operational amplifier.

* * * * *